United States Patent [19]
Grohmann

[11] 3,965,336
[45] June 22, 1976

[54] RADIO OR TELEVISION RECEIVER WITH AN AUTOMATIC STATION FINDING ARRANGEMENT

[75] Inventor: Lothar Grohmann, Pforzheim, Germany

[73] Assignee: International Standard Electric Corporation, New York, N.Y.

[22] Filed: Nov. 14, 1974

[21] Appl. No.: 523,643

[30] Foreign Application Priority Data
Nov. 16, 1973 Germany............................ 2357359

[52] U.S. Cl....................... 235/92 FQ; 235/92 TF; 235/92 CT; 235/92 R; 325/455; 325/470
[51] Int. Cl.²........................................ H03K 21/36
[58] Field of Search......... 235/92 FQ, 92 B, 92 MS, 235/92 TF, 92 CT, 92 MT, 92 SH; 325/325, 455, 464, 468, 470

[56] References Cited
UNITED STATES PATENTS

| | | |
|---|---|---|
| 3,651,469 | 3/1972 | Keese................................. 325/470 |
| 3,671,870 | 6/1972 | Wellhausen......................... 325/470 |
| 3,800,230 | 3/1974 | Marks et al.......................... 325/470 |
| 3,803,495 | 4/1974 | Reynolds ............................. 325/470 |
| 3,845,394 | 10/1974 | Hamada............................... 325/470 |
| 3,864,637 | 2/1975 | Kanow................................. 325/470 |
| 3,882,400 | 5/1975 | Hamada............................... 325/468 |

*Primary Examiner*—Gareth D. Shaw
*Assistant Examiner*—John P. Vandenburg
*Attorney, Agent, or Firm*—John T. O'Haloran; Menotti J. Lombardi, Jr.; Peter Van Der Sluys

[57] ABSTRACT

In a radio or television receiver containing an automatic station finder with a digital counter, a clock generator, and a digital-to-analog converter forming the tuning voltage for the varactors, a recall memory consisting of two series-connected parallel memories is connected in parallel with the digital counter. At a stop signal from the automatic station finder the first parallel memory records the instantaneous count of the digital counter; at an automatic-station-finding start signal the second parallel memory, to which the parallel input of the digital counter is connected, records the contents of the first parallel memory.

9 Claims, 3 Drawing Figures

RADIO OR TELEVISION RECEIVER WITH AN AUTOMATIC STATION FINDING ARRANGEMENT

The present invention relates to a radio or television receiver with an automatic station finding arrangement which contains a pulse generator, a circulating counter formed from semiconductor counting flip-flops and having parallel inputs, a digital-to-analog converter converting the count of the counter to a tuning voltage, and a start-stop circuit acting on the flow of counting pulses and controlled over a start and at least one stop line, and with a parallel memory connected between the parallel outputs and parallel inputs of the counter.

Such a radio receiver is known from, e.g., the journal "Funkschau 1971", pp. 535 to 538 and 587 to 589. With the aid of the free-running pulse generator, the up-counter, and the digital-to-analog converter, the automatic station finding arrangement generates a sawtoothlike tuning voltage for the varactors contained as frequency-setting tuning elements in the resonant circuits of the receiver's radio-frequency portion. If a transmitter is received which meets the receiving criteria set in the receiver, the pulse generator is stopped so that the tuning voltage now remains constant until the operator continues the automatic station finding operation by actuating a start switch.

It is frequently desirable to tune in once again the station at which the start switch for automatic station finding was actuated last - either for comparison or because of the more interesting program. To do this in the case of a receiver with provision for unidirectional automatic station search, the entire search range must be scanned once or several times by repeatedly actuating the start switch, depending on whether the desired station is detected immediately or not.

It is the object of the invention to provide measures for a receiver of the kind referred to by way of introduction which permit the transmitter received before the actuation of the start switch to be found again with a high degree of safety by simple manipulation.

The invention is characterized in that the parallel memory consists of two series-connected parallel memories having one transfer input each, that the transfer input of the (first) parallel memory, whose parallel inputs are connected to the parallel outputs of the counter, are connected directly or indirectly to the stop line, that the transfer input of the (second) parallel memory, whose parallel outputs are connected to the parallel inputs of the counter, is connected directly or indirectly to the start line, that the counter has a set input for through-connecting the parallel inputs of the counter to the flip-flops of the counter, and that a recall switch is connected to the set input of the counter.

Particularly advantageously, the memory locations of the two series-connected parallel memories are storage flip-flops using semiconductor technology. In that case it is possible to arrange the counter and the parallel memories on a common chip of an integrated-circuit module. Such a module has only two terminals more than a module formed by the counter only.

The measures characterized by the invention thus require, aside from an additional recall switch, no additional space and involve nearly no additional expense. To recall the station previously tuned in it is only necessary to depress a button, for example, whereby the receiver is safely tuned to the station's carrier wave even if at the instant of the depression the local received field strength is temporarily too low for sufficient reception.

The invention will now be described in more detail with reference to the accompanying drawing, showing, by way of example, two embodiments of the invention, and wherein.

Figure 1:
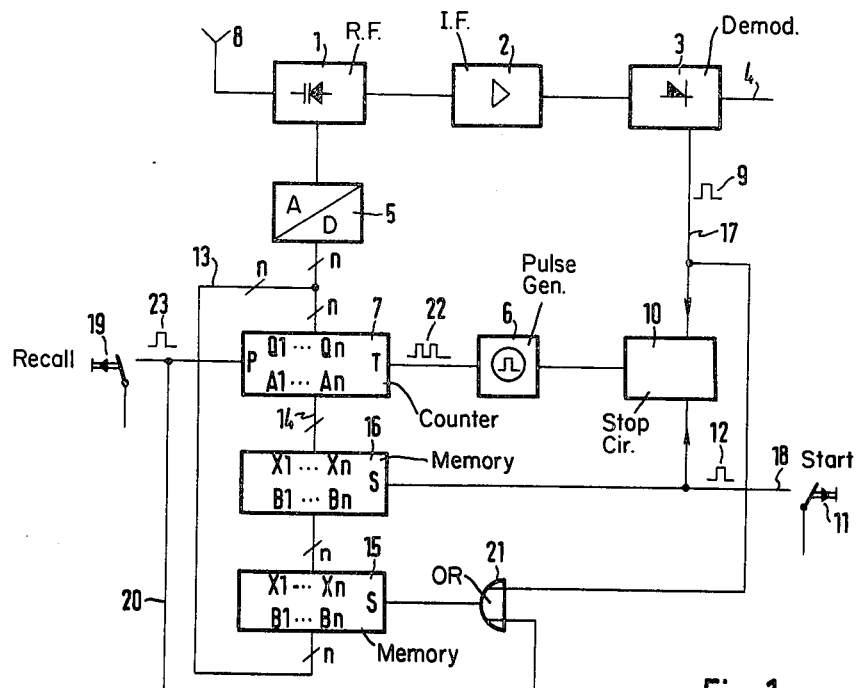
FIG. 1 is a block diagram showing the radio- and intermediate-frequency portions of a receiver with an automatic station finding arrangement and a recall arrangement.
Figure 3:
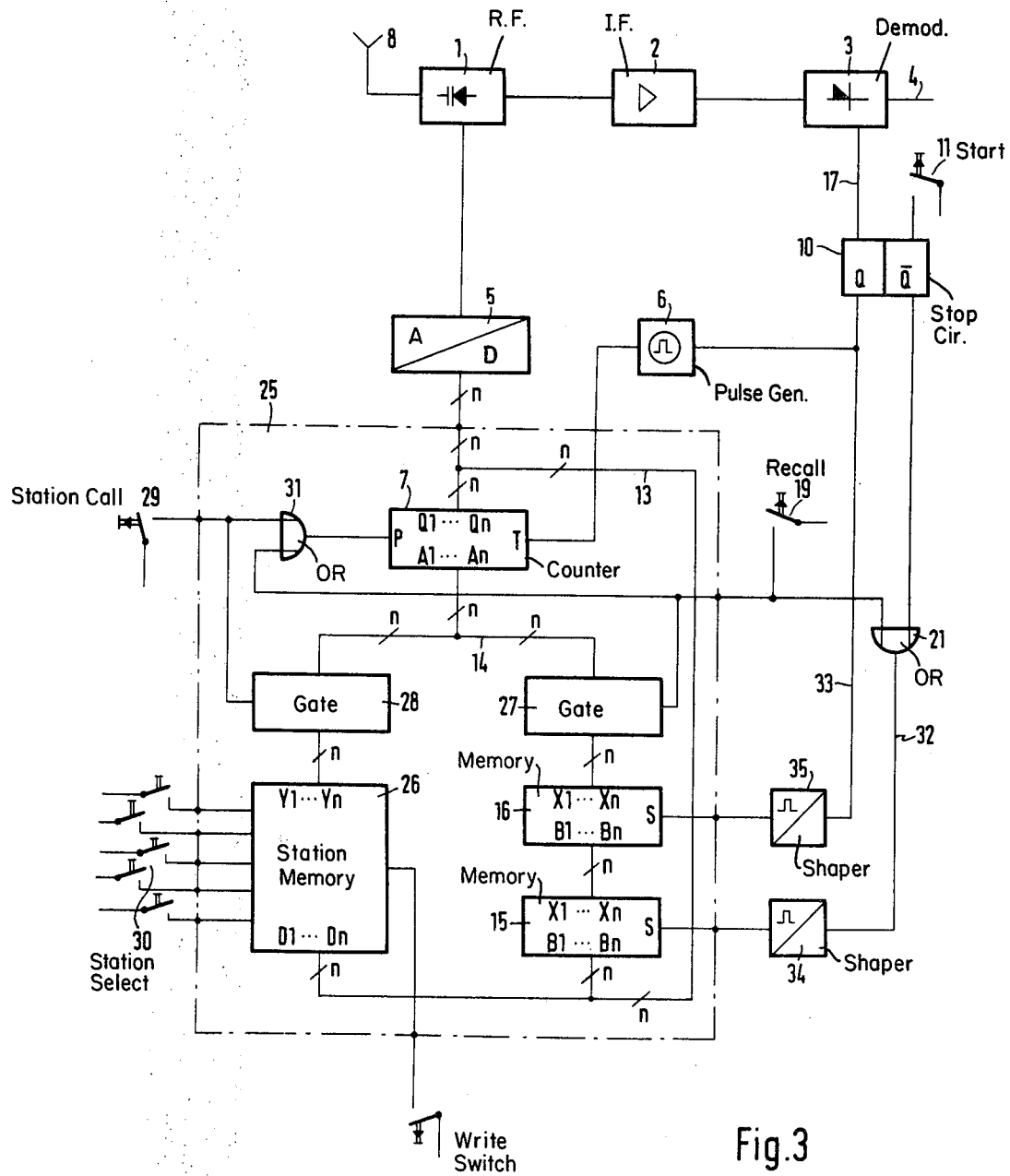
FIG. 3 shows a receiver similar to the one of FIG. 1 in which the automatic station finding counter and the recall memories are arranged together on the chip of an integrated-circuit module.

The receivers shown in the block diagrams of FIGS. 1 and 3 have a radio-frequency-receiving section 1, an intermediate-frequency amplifier 2, and a demodulator section 3, to whose output 4 are connected the arrangements processing the modulation frequency. The tunable resonant circuits of the radio-frequency section contain varactors as tuning elements. Connected to the radio-frequency section is an automatic station finding arrangement in which a digital-to-analog converter 5 generates from the count of a digital counter 7, which receives signals at a stepping input T and advances at the rate of a pulse generator 6, a nearly sawtooth-shaped tuning voltage for the varactors. With a sufficient received field strength at the antenna 8 of the receiver a signal is formed in the demodulator section 3 which signal can be used as stop signal 9 to change the state of a start-stop circuit 10 which may be a flip flop. In the "stop" state the start-stop circuit interrupts the pulse generation or the pulse flow in the pulse generator so that the receiver remains tuned to the station being received. By operating a start-button switch 11 a start signal 12 is generated in the receiver which signal places the start-stop circuit in the "automatic station finding" state and thus continues the automatic station finding operation until next station meeting the receiver's receiving requirements is received.

In the embodiment of FIG. 1, two series-connected parallel memories 15 and 16 are connected, respectively, over two groups of lines 13 and 14 consisting of n lines each, between the n outputs $Q_{11}$ to $Q_{n1}$ and the parallel inputs $A_{11}$ to $A_{n1}$ of the digital counter 7 containing $n$ counting flip-flops. Each parallel memory contains n storage flip-flops and, besides the parallel bit inputs and outputs B and X, a transfer input S. If a transfer signal appears at the transfer input, the parallel memory records the bit word applied its parallel inputs $B_1$ to $B_n$, which erases the previously entered bit word and now, in turn, appears at the memory outputs $X_1$ to $X_n$.

The transfer input S of the parallel memory 15, whose parallel inputs are connected over the group of lines 13 to the outputs of the counter 7, is connected to the stop line 17, while the transfer input S of the parallel memory 16, whose parallel outputs are connected over the group of lines 14 to the parallel inputs of the counter 7, is connected to the start line 18.

Connected to a set input P of the digital counters 7 is a switch 19 whose operation generates a set signal. The set signal sets the counter to a count which is equal to the bit word at the parallel inputs $A_1$ to $A_n$ of the counter. At the same time, the set signal acts over the line 20 and via an OR circuit provided for isolation on the transfer input S of the first parallel memory 15.

Figure 2:
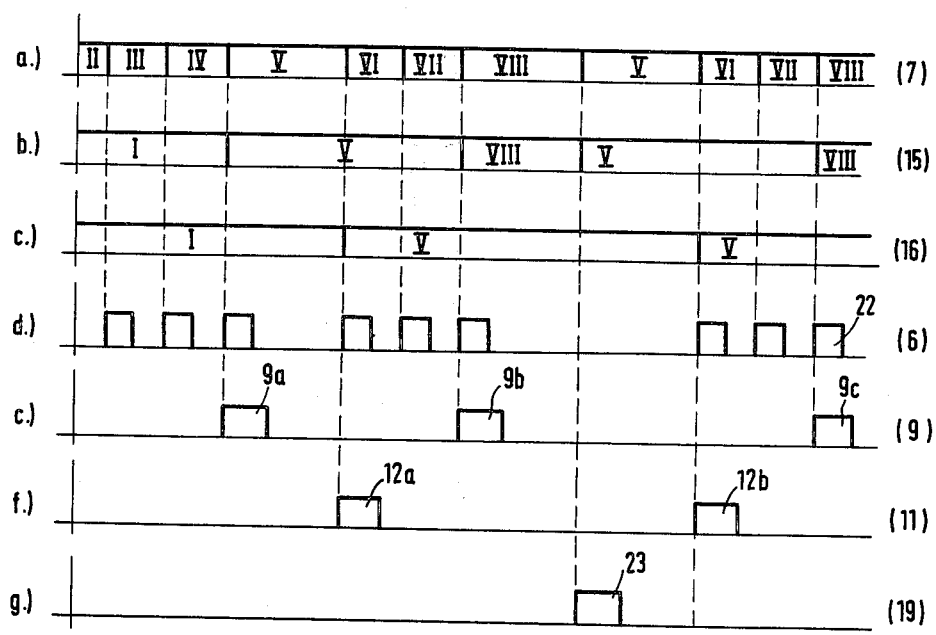
FIG. 2 shows diagrams $a$ to $g$ explaining the operation of the recall storage.

The diagrams a to g of FIG. 2 explain the operation of the automatic station finding arrangement in conjunction with the recall memories. In diagram a each of the blocks II, III, etc. represents the bit word for a count of the digital counter 7. The blocks in the diagrams b and c are the bit words which are stored in the parallel memories 15 and 16 and can be taken off the latter's parallel outputs, the blocks with equal Roman numerals (e.g. V) representing equal bit words. The diagram d shows the counting pulses 22 for the digital counter 7, the diagram e the stop pulses 9, the diagram f the start pulses 12, and the diagram g the set pulse 23 triggered by the recall switch 19.

The respective count from which the digital-to-analog converter 5 forms the tuning voltage for the varactors is applied simultaneously to the input of the digital-to-analog converter and, as a bit word (e.g. II, III, IV . . . , diagram a), to the input of the first parallel memory 15. At the occurence of a stop signal 9 during the automatic station finding operation, the stop signal 9 acts as a transfer signal on the first parallel memory 15, and the count (e.g. V, diagram a) at which the stop pulse (e.g. 9a) was generated is entered into the first parallel memory 15 (V in diagram b). At the next start pulse 12a triggered via the start-button switch 11 the automatic station finding operation begins anew, starting from the instantaneous count (e.g. V, diagram a) of the counter. The start signal (12a in diagram f) acts as a transfer signal on the transfer input S of the second parallel memory 16, whereby the second parallel memory takes over the bit word (e.g. V) of the first. The next stop signal (e.g. 9b, diagram e) at a new count (e.g. VIII, diagram a) stops the automatic station search and enters the new count as a bit word (e.g. VIII, diagram b) into the first parallel memory 15.

If the operator operates the recall switch 19 so as to recall the setting to the previously received station, the set pulse 23 triggered by the recall switch sets the counter 7 to the count (e.g. V, diagram a) of the bit word (e.g. V, diagram c) stored in the second parallel memory 16, and the newly set count is entered into the first parallel memory 15 (e.g. V, diagram b). The next start signal (e.g. 12b, diagram f) initiates the automatic station finding operation as described.

In the embodiment of FIG. 3, the two series-connected parallel memories 15 and 16 are incorporated on the chip of an integrated-circuit module 25 which also comprises the circulating digital counter 7 and, for example, the circuit 26 of a station memory device. The station memory device has the memory inputs $D_1$ to $D_n$ and the memory outputs $Y_1$ to $Y_n$ of its circuit 26 connected in parallel with the digital counter 7 in the same manner as the recall memory consisting of the two series-connected parallel memories 15 and 16. Therefore, gate circuits 27 and 28 are inserted between the parallel outputs of these memories and the parallel inputs $A_1$ to $A_n$ of the digital counter. The gate circuit 27 between the recall memory and the counter is opened by the set signal of the recall switch 19. The gate circuit 28 between the station memory and the counter is opened by the set signal of a switch 29 for calling the bit word of a station preselected by the station buttons 30. In front of the set input 8 of the digital counter the two set signals are separated from one another in an OR circuit 31.

In the embodiment of FIG. 3, the start-stop circuit 10 is designed in the manner of a flip-flop and can assume a "stop" state and an "automatic station finding" state. The transfer inputs S of the recall memory's parallel memories 15 and 16 are connected via the lines 32 and 33 to the outputs of the start-stop circuit. Since the signals at the outputs of the start-stop circuit are continuous signals, the lines 32 and 33 to the transfer inputs include pulse shapers 34 and 35, respectively.

In embodiments corresponding to FIG. 3 and having no station memory device, besides the circuit 26, the gate circuits 27 and 28 and the OR circuit 31 are omitted.

What is claimed is:

1. A receiver having automatic station finding capability, comprising:
   means for tuning said receiver in response to an applied voltage;
   a controllable pulse generator;
   means for starting said pulse generator;
   circulating counter means having parallel inputs and outputs, a stepping input and a set input, said stepping input connected to and responsive to pulses from said pulse generator for providing a variable digital output;
   digital-to-analog converting means for converting the variable digital output from said counter means to a variable analog voltage, said voltage being applied to said tuning means, so that the receiver is tuned to a frequency corresponding to the analog voltage;
   means for sensing a received signal and for providing a stop signal to the pulse generator in response thereto, whereby said generator stops providing pulses and the analog voltage remains constant keeping the receiver tuned to the received signal;
   memory means having parallel inputs connected to the parallel outputs of said counter means and parallel outputs connected to the parallel inputs of said counter means;
   means associated with said memory means for causing the memory means to store a particular digital output from said counter means; and
   means associated with the set input of said counter means for selectively causing the digital signal at the counter input to be transferred to the counter output.

2. A receiver as described in claim 1, wherein the memory means comprises: two series connected parallel memories each having a transfer input, a first of said parallel memories having parallel inputs connected to the parallel outputs of the counter means and having the transfer input connected to the stop signal means, a second of said parallel memories having parallel outputs connected to the parallel inputs of the counter means and having the transfer input connected to the means for starting said pulse generator.

3. A receiver as described in claim 2, wherein each of said parallel memories comprises a plurality of semiconductor voltage flip-flops.

4. A receiver as described in claim 2, wherein the two series connected parallel memories are incorporated in an integrated circuit module with the counter means.

5. A receiver as described in claim 2, wherein the transfer input of the first parallel memory is also connected to the means associated with the set input of the counter means.

6. A receiver as described in claim 1, additionally comprising:
- an additional memory means having parallel inputs and outputs;
- means for connecting the inputs of said additional memory means to the counter means output and the outputs of said additional memory means to the counter inputs;
- means for causing said additional memory means to store a digital output; and
- means for transferring the stored digital output to the counter means input through the connecting means.

7. A receiver as described in claim 6, additionally comprising gate means disposed at the outputs of the memory means and the additional memory means for selectively connecting either the additional memory means or the memory means to the input of the counter.

8. A receiver as described in claim 6, wherein the additional memory means comprises a plurality of memories and the connecting means comprises a plurality of station switches corresponding in number to the number of additional memories.

9. A receiver as described in claim 1, wherein each memory means comprises a number of flip-flops corresponding to the number of digits to be stored.

* * * * *